(12) United States Patent
Nazarian et al.

(10) Patent No.: US 7,558,101 B1
(45) Date of Patent: Jul. 7, 2009

(54) SCAN SENSING METHOD THAT IMPROVES SENSING MARGINS

(75) Inventors: Hagop Nazarian, San Jose, CA (US); Michael Achter, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 27 days.

(21) Appl. No.: 11/957,366

(22) Filed: Dec. 14, 2007

(51) Int. Cl.
*G11C 11/00* (2006.01)
*G11C 11/15* (2006.01)
*G11C 11/34* (2006.01)

(52) U.S. Cl. ............... 365/148; 365/151; 365/158; 365/163; 365/171; 365/173

(58) Field of Classification Search ............... 365/148, 365/151, 163, 158, 171, 173

See application file for complete search history.

(56) References Cited

U.S. PATENT DOCUMENTS

| | | | | |
|---|---|---|---|---|
| 7,221,599 | B1 * | 5/2007 | Gaun et al. | 365/151 |
| 7,254,053 | B2 * | 8/2007 | Krieger et al. | 365/151 |
| 7,289,353 | B2 * | 10/2007 | Spitzer et al. | 365/151 |
| 7,453,747 | B2 * | 11/2008 | Abraham et al. | 365/158 |

\* cited by examiner

*Primary Examiner*—Trong Phan
(74) *Attorney, Agent, or Firm*—Turocy & Watson, LLP

(57) ABSTRACT

Systems and methods for improving memory cell sensing margins by utilizing an optimal reference stimulus. A stimulus component applies a plurality of different reference stimuli to a plurality of memory cells of a memory device. A sense component senses a characteristic of each memory cell of the plurality of memory cells as a function of the serially applied plurality of different reference stimuli. An analysis component computes an optimal reference stimulus by selecting one of the plurality of different reference stimuli, the one of the plurality of different reference stimuli associated with an absolute minima of number of memory cell characteristics that changed state as a function of the applied plurality of different reference stimuli.

20 Claims, 10 Drawing Sheets

SCAN SENSING METHOD THAT IMPROVES SENSING MARGINS

TECHNICAL FIELD

This disclosure relates generally to systems for sensing memory devices and in particular, but not exclusively, relates to a scan sensing method that improves sensing margins.

BACKGROUND

A wide variety of memory devices can be used to maintain and store data and instructions for various computers and similar systems, including non-volatile memory devices that do not require power to retain information (e.g., EPROM, EEPROM, and Flash memory).

Memory devices contain memory cells, which store information in the form of binary bit(s) (e.g., logic "0", "1", "00", "01", "10", or "11"). This information is retrieved by sensing the state of memory cells, e.g., by sensing current drawn by a memory cell and comparing such current with a reference current. For example, if the sensed current drawn by a memory cell exceeds a reference current, the memory cell's state is considered to be a logic 1; otherwise, the memory cell's state is considered to be a logic 0.

One concern with sensing the state of a memory cell is reduced sensing margin. Improving sensing margin, which is the amount of sensed current/voltage above or below a fixed reference current/voltage, increases the usable lifetime of a memory cell. Sensing margin and the usable lifetime of a memory cell are reduced when a memory cell's characteristics (e.g., threshold voltage) change over time, affecting how data stored in the memory cell is evaluated. For example, if at the beginning of life of a memory cell, current sensed during a read operation of the memory cell exceeds a fixed reference current, the state of the memory cell is considered to be a logic 1. However, if after a period of time, current sensed during a read operation of the memory cell is below the fixed reference current (e.g., due to charge retention), the state of the memory cell is considered to be a logic 0.

Dynamic tracking reference devices can be used to improve sensing margin by reflecting the degree that a memory cell's characteristics have changed over time. However, dynamic tracking reference device performance is limited because dynamic reference device characteristics can differ from memory cell device characteristics, e.g., the sensing margin of a dynamic tracking reference device can differ from the sensing margin of a memory cell. Further, although sensing margin can be improved by utilizing trim bits to reflect individual memory cell characteristics, the use of trim bits increases memory cell programming overhead involved in memory device manufacturing and testing, and increases memory device design complexity.

It is therefore desirable to have systems and methods that improve memory cell sensing margins, reduce overhead involved in memory device manufacturing and testing, and reduce memory device design complexity.

SUMMARY

The claimed subject matter relates to systems and methods for improving memory cell sensing margins by utilizing an optimal reference stimulus. Conventional sensing techniques utilizing dynamic tracking reference devices are limited since characteristics of such devices can differ from those of memory cell devices. Further, conventional sensing techniques utilizing trim bits to account for memory cell characteristics are limited because such techniques increase memory cell programming overhead.

Compared to traditional sensing methods, the novel scan sensing systems and methods of the claimed subject matter have various advantages. The usable lifetime of memory cells is increased because overall sensing margin is improved. Trim bit overhead and issues concerning the lack of sensitivity of static and dynamic tracking references to changes in memory cell characteristics are eliminated because the optimum reference stimulus is determined by sensing a memory cell characteristic as a function of the applied stimuli to determine an absolute minima point between distributions of a memory cell characteristic.

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject invention provides systems and methods that improve memory cell sensing margins by utilizing an optimal reference stimulus. In accordance with one aspect of the disclosed subject matter, a stimulus component can be employed to apply a plurality of different reference stimuli to a plurality of memory cells of a memory device. A sense component can be employed to sense a characteristic of each memory cell of the plurality of memory cells. An analysis component can be employed to compute an optimal reference stimulus by selecting one of the plurality of different reference stimuli, the one of the plurality of different reference stimuli associated with an absolute minima of number of memory cell characteristics that changed state as a function of the applied plurality of different reference stimuli. Further, the sense component can sense the characteristic of each memory cell of the plurality of memory cells as a function of the applied optimal reference stimulus.

In one embodiment, the stimulus component can serially apply n different reference stimuli. The sense component can sense a characteristic of each memory cell as a function of the serially applied n different reference stimuli. A data store component can store the sensed characteristic of each memory cell. The analysis component can compute the optimal reference stimulus by selecting one of the serially applied n different reference stimuli, the one of the serially applied n different reference stimuli associated with an absolute minima of number of memory cell characteristics that changed state as a function of the serially applied n different reference stimuli.

In another embodiment, the stimulus component comprises at least one of voltage or current. The sense component comprises one or more outputs of one or more window comparators, the one or more window comparators coupled to at least one memory cell of the plurality of memory cells. The analysis component computes the optimal reference stimulus by selecting a reference stimulus within a window region of one of the one or more window comparators, the least number of memory cells activating the one or more outputs of the one of the one or more window comparators.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents.

Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of systems and methods that improve memory cell sensing margins by utilizing an optimal reference stimulus are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
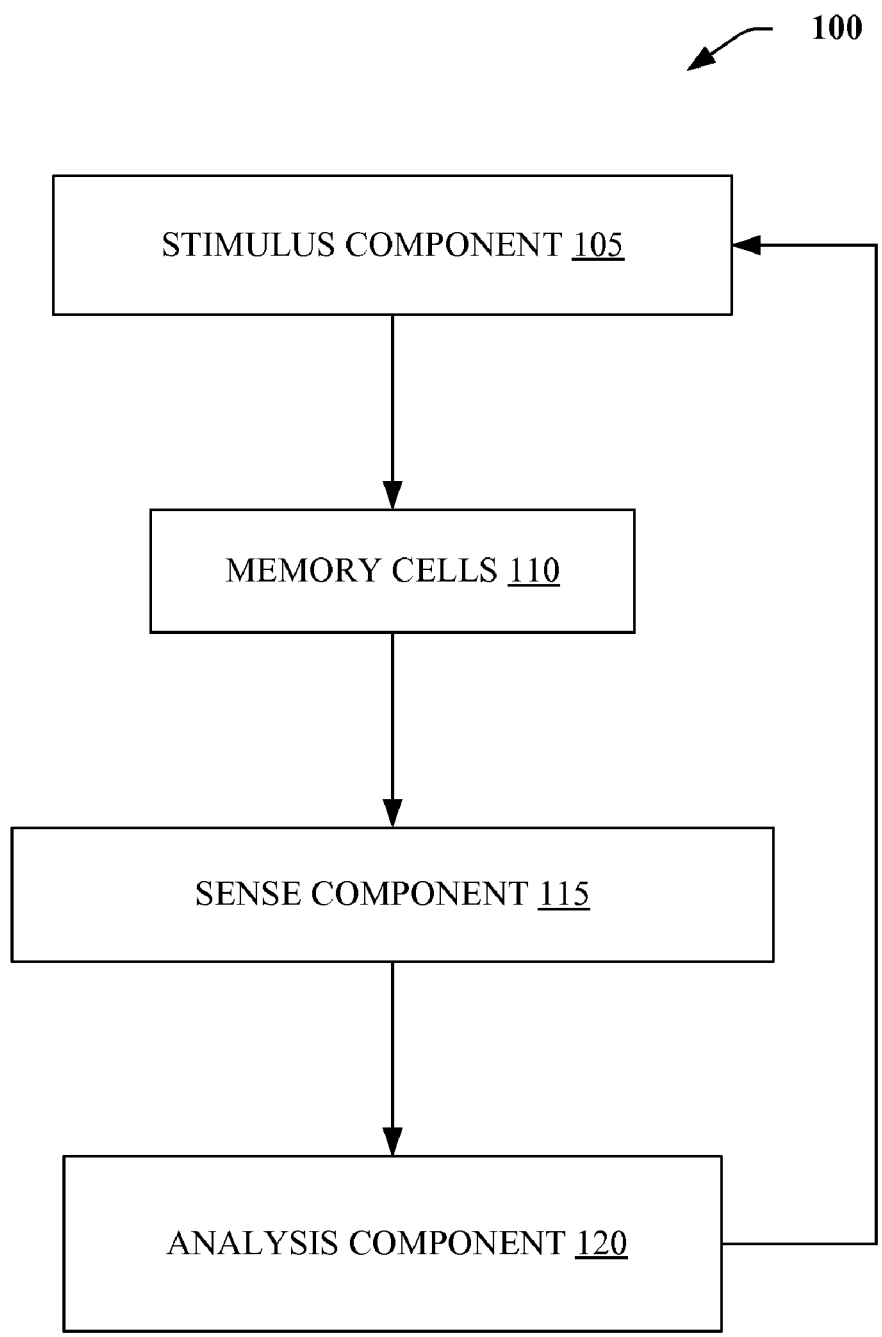
FIG. 1 is a demonstrative system for improving memory cell sensing margins, in accordance with an embodiment of the invention.

The subject invention provides systems and methods that improve memory cell sensing margins. Embodiments of the invention include techniques for applying an optimal reference stimulus to a memory cell, thereby increasing the usable lifetime of the memory cell and eliminating issues concerning trim bit overhead and lack of sensitivity of static and dynamic tracking references to changes in memory cell characteristics. FIG. 1 is a demonstrative system 100 for improving memory cell sensing margins, in accordance with an embodiment of the invention. System 100 and the systems and processes explained below may constitute machine-executable instructions embodied within a machine (e.g., computer) readable medium, which when executed by a machine will cause the machine to perform the operations described. Additionally, the systems and processes may be embodied within hardware, such as an application specific integrated circuit ("ASIC") or the like. The order in which some or all of the process blocks appear in each process should not be deemed limiting. Rather, it should be understood by a person of ordinary skill in the art having the benefit of the instant disclosure that some of the process blocks may be executed in a variety of orders not illustrated.

In system 100, a stimulus component 105 can apply a plurality of different reference stimuli to a plurality of memory cells 110. A sense component 115 can sense a characteristic of each memory cell of the plurality of memory cells 110 as a function of the applied plurality of different reference stimuli. An analysis component 120 can compute an optimal reference stimulus by selecting one of the plurality of different reference stimuli, the one of the plurality of different reference stimuli associated with an absolute minima of number of memory cell characteristics that changed state as a function of the applied plurality of different reference stimuli.

Further, the stimulus component 105 can apply the optimal reference stimulus to each memory cell of the plurality of memory cells 110. The sense component 115 can sense the characteristic of each memory cell of the plurality of memory cells 110 as a function of the applied optimal reference stimulus. In one embodiment, the plurality of different reference stimuli applied by stimulus component 105 comprises at least one of voltage or current. Further, the sensed characteristic of each memory cell of the plurality of memory cells 110 comprises at least one of drain current, threshold voltage, logic state, or an output of one or more sense amplifiers, the one or more sense amplifiers coupled to at least one memory cell of the plurality of memory cells 110. However, it should be appreciated that stimulus component 105 can apply any stimulus to each memory cell of the plurality of memory cells 110, and sense component 115 can sense any characteristic of each memory cell of the plurality of memory cells 110.

In accordance with one embodiment, each memory cell of the plurality of memory cells 110 can be a volatile or non-volatile memory cell. In accordance with another embodiment, each memory cell of the plurality of memory cells 110 is at least one of flash memory (e.g., single-bit flash memory, multi-bit flash memory), read only memory ("ROM"), programmable ROM ("PROM"), erasable PROM ("EPROM"), electronically erasable PROM ("EEPROM"), random access memory ("RAM"), synchronous RAM ("SRAM"), dynamic RAM ("DRAM"), synchronous DRAM ("SDRAM"), double data rate SDRAM ("DDR SDRAM"), enhanced SDRAM ("ESDRAM"), Synchlink DRAM ("SLDRAM"), Rambus direct RAM ("RDRAM"), direct Rambus dynamic RAM ("DRDRAM"), Rambus dynamic RAM ("RDRAM"), or a combination thereof. Unlike conventional sensing systems and/or methods, which can decrease the usable lifetime of memory cells and suffer from issues concerning trim bit overhead and lack of sensitivity of static and dynamic tracking references to changes in memory cell characteristics, the subject invention provides systems and methods that improve memory cell sensing margins by applying an optimum reference stimulus.

Figure 2:
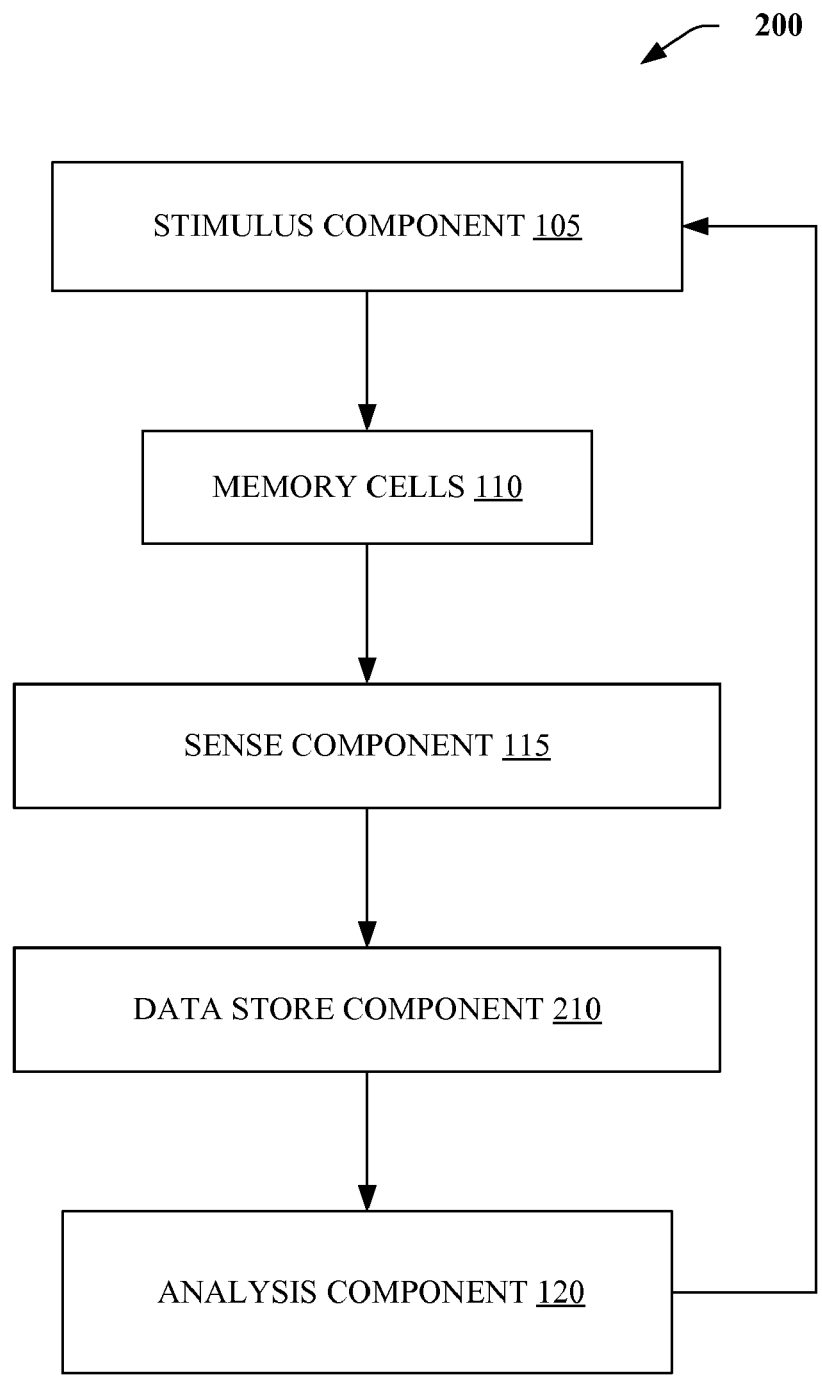
FIG. 2 is a demonstrative data store based system for improving memory cell sensing margins, in accordance with an embodiment of the invention.

FIG. 2 is a demonstrative data store based system 200 for improving memory cell sensing margins, in accordance with an embodiment of the invention. Data store system 200 can contain data store component 210, which can store a sensed characteristic of each memory cell of the plurality of memory cells 110. In one embodiment, data store component comprises a memory location. In other embodiments, data store component comprises a latch. In one embodiment, data store component can comprise a capacitor, the capacitor storing data in the form of retained charge. However, it should be appreciated that data store component 210 can comprise any type of device or function that is capable of retaining a state of a sensed characteristic of each memory cell of the plurality of memory cells 110. Analysis component 120 can compute the optimal reference stimulus as a function of the sensed characteristics stored by data store component 210.

Figure 3:
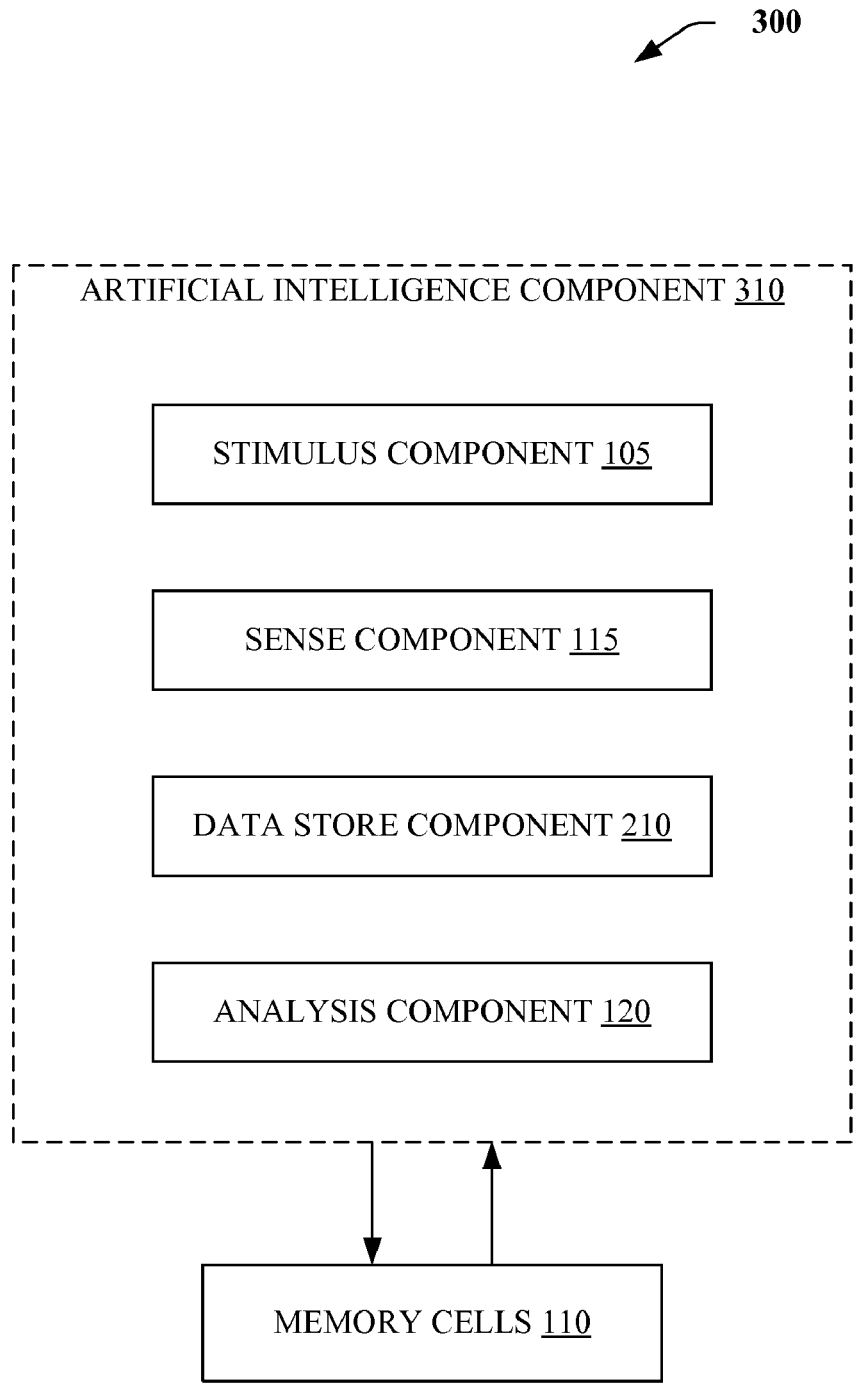
FIG. 3 is a demonstrative artificial intelligence based system for improving memory cell sensing margins, in accordance with an embodiment of the invention.

In accordance with an embodiment of the invention demonstrated by FIG. 3, an artificial intelligence based system 300 can improve memory cell sensing margins. Artificial intelligence based system 300 can contain an artificial intelligence component 310, in which data store component 210 can store a characteristic of each memory cell of the plurality of memory cells 110 sensed by sense component 115. Analysis component 120 can automatically compute the optimal reference stimulus as a function of the characteristics stored by data store component 210. In one embodiment of artificial intelligence based system 300, artificial intelligence component 310 is a closed-loop feedback system that automatically computes the optimal reference stimulus based on values sensed by sense component 115 and stored by data store component 210. Further, artificial intelligence component 310 can automatically apply the optimal reference stimulus to the plurality of memory cells 110 and sense the characteristic of each memory cell of the plurality of memory cells 110 as a function of the applied optimal reference stimulus.

Figure 4:
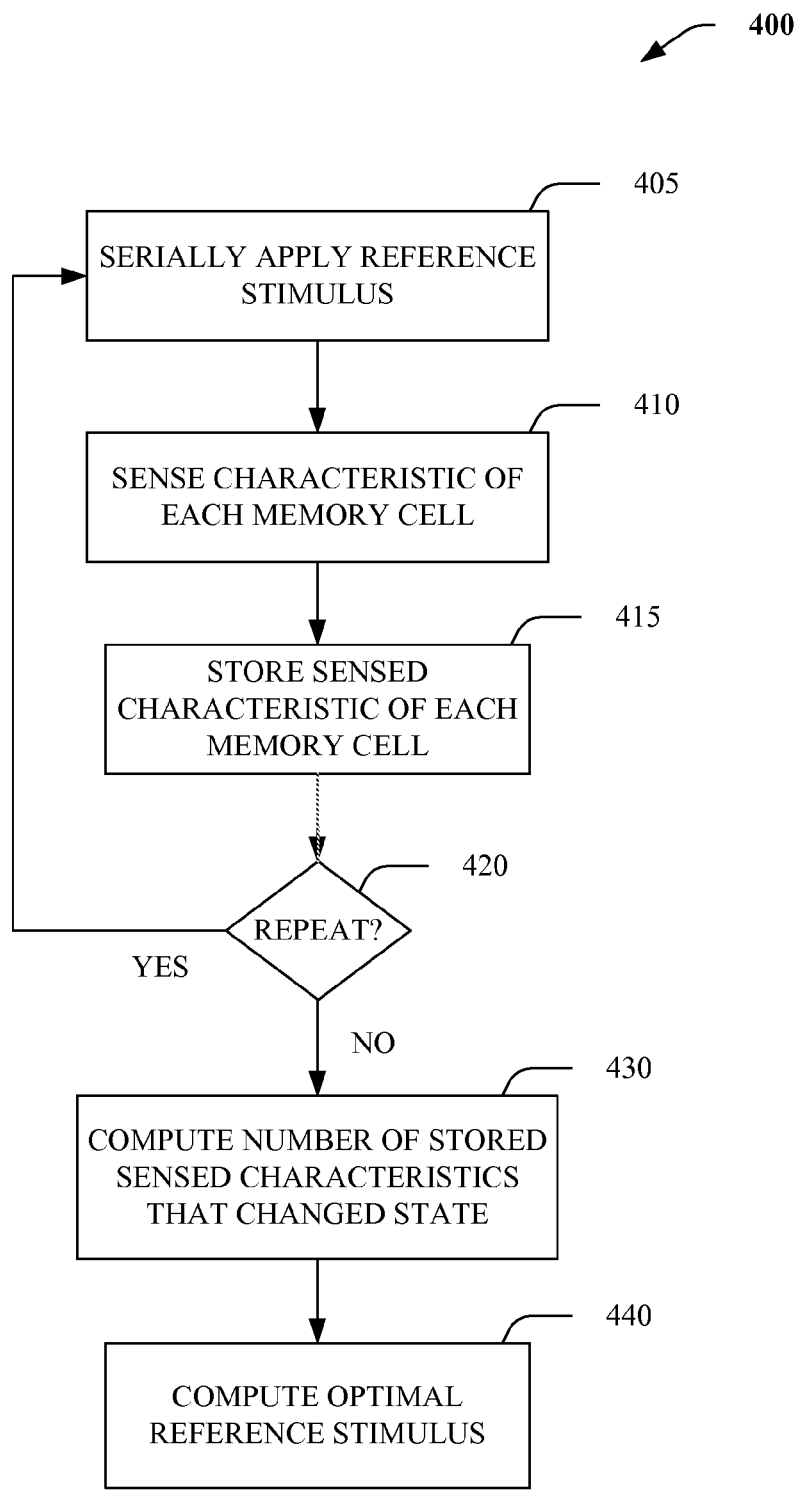
FIG. 4 is a flow chart illustrating computing an optimal reference stimulus, in accordance with an embodiment of the invention.

FIG. 4 is a flow chart illustrating a process 400 for computing an optimal reference stimulus, in accordance with an embodiment of the invention. At 405, stimulus component 105 can apply an nth different reference stimulus to each memory cell of the plurality of memory cells 110. In a process block 410, sense component 115 can sense a characteristic of each memory cell of the plurality of memory cells 110 as a function of the applied nth different reference stimulus. At 415, data store component 210 can store the sensed characteristic of each memory cell of the plurality of memory cells 110. At a decision block 420, it can be decided whether to continue applying reference stimuli.

Process 400 continues to process block 430 after n different reference stimuli have been applied. At 430, analysis component 120 can compute the number of stored characteristics that changed state as a function of the serially applied n different reference stimuli. At 440, analysis component 120 can compute an optimal reference stimulus by selecting one of the serially applied n different reference stimuli, the one of the serially applied n different reference stimuli associated with an absolute minima of number of memory cell characteristics that changed state as a function of the serially applied n different reference stimuli.

Figure 5:
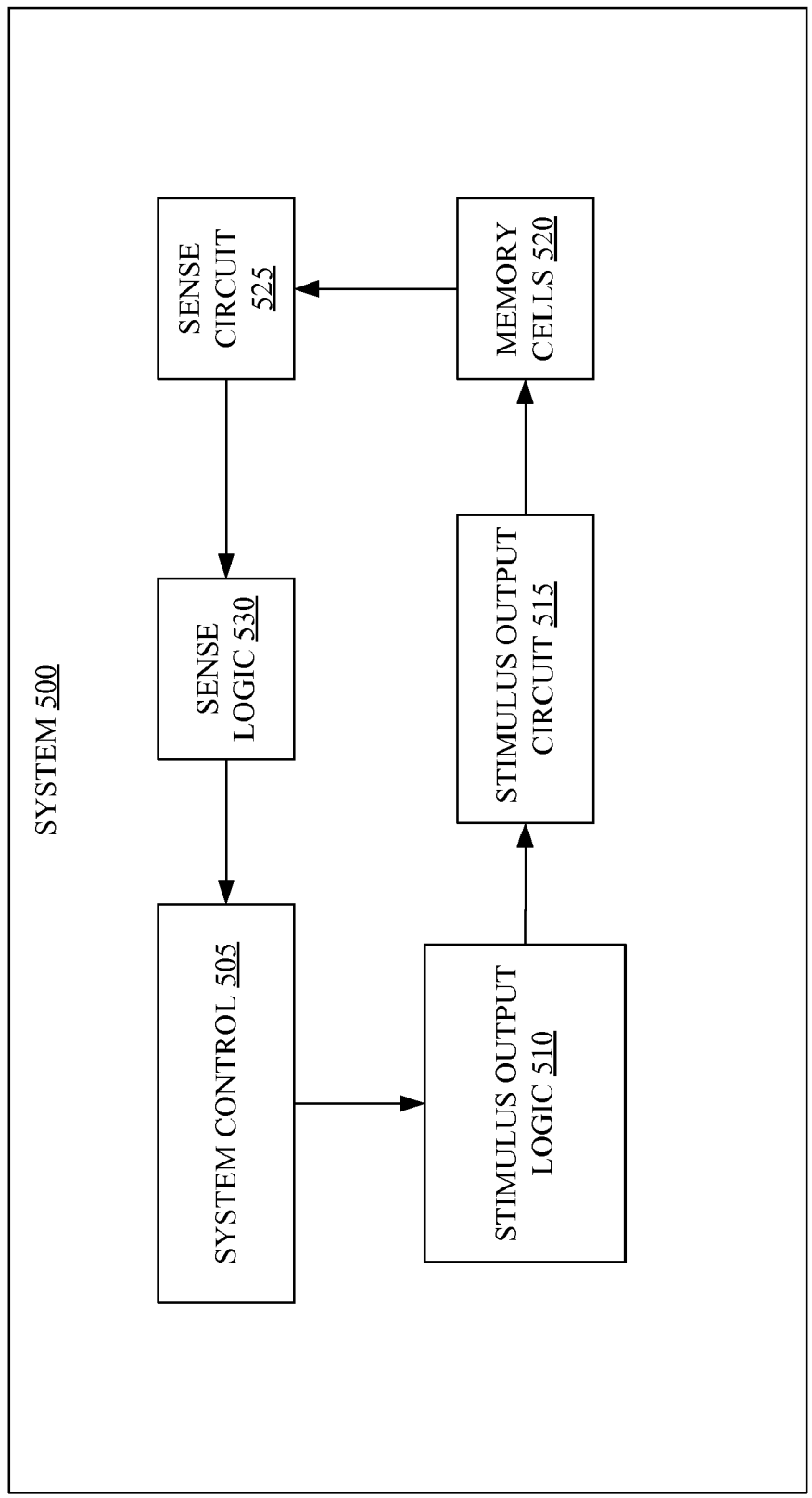
FIG. 5 is a demonstrative system for improving memory cell sensing margins, in accordance with an embodiment of the invention.

FIG. 5 is a block diagram illustrating a demonstrative system 500 for improving memory cell sensing margins, in accordance with an embodiment of the invention. System control 505 can receive input from sense logic 530 and can control stimulus output logic 510. System control 505 may include a computer that contains a central processing unit for making computations and performing various program and data transfers, and may also contain memory for program and data storage. Stimulus output logic 510 can receive information from system control 505, and may include decode logic that decodes the information received from system control 505 to control stimulus output circuit 515. Stimulus output circuit 515 can receive control logic from stimulus output logic 510 and can translate the control logic into at least one of voltage or current applied to memory cells 520.

Each memory cell of memory cells 520 may be a volatile or non-volatile memory. Each memory cell of memory cells 520 can also be at least one of flash memory, multi-bit flash memory, read only memory (ROM), programmable ROM (PROM), erasable programmable read only memory (EPROM), electronically erasable programmable read only memory (EEPROM), random access memory ("RAM"), synchronous RAM ("SRAM"), dynamic RAM ("DRAM"), synchronous DRAM ("SDRAM"), double data rate SDRAM ("DDR SDRAM"), enhanced SDRAM ("ESDRAM"), Synchlink DRAM ("SLDRAM"), Rambus direct RAM ("RDRAM"), direct Rambus dynamic RAM ("DRDRAM"), Rambus dynamic RAM ("RDRAM"), or a combination thereof.

Sense circuit 525 can sense at least one of drain current, threshold voltage, logic state, or an output of the one or more sense amplifiers, the one or more sense amplifiers coupled to at least one memory cell of the plurality of memory cells 520, and can transmit signals to sense logic 530. Sense circuit 525 may include multiple static references, comparators, window comparators, sense amplifiers, and any other elements that comprise sense circuits. Sense logic 530 can receive signals sent by sense circuit 525 and can translate the signals into logic that can be received by system controller 505. Sense logic 530 may translate the signals using encoding logic. It should be understood by a person of ordinary skill in the art having the benefit of the instant disclosure that system 500 may comprise any hardware and/or software necessary to perform the above illustrated embodiments of the invention.

Figure 6:
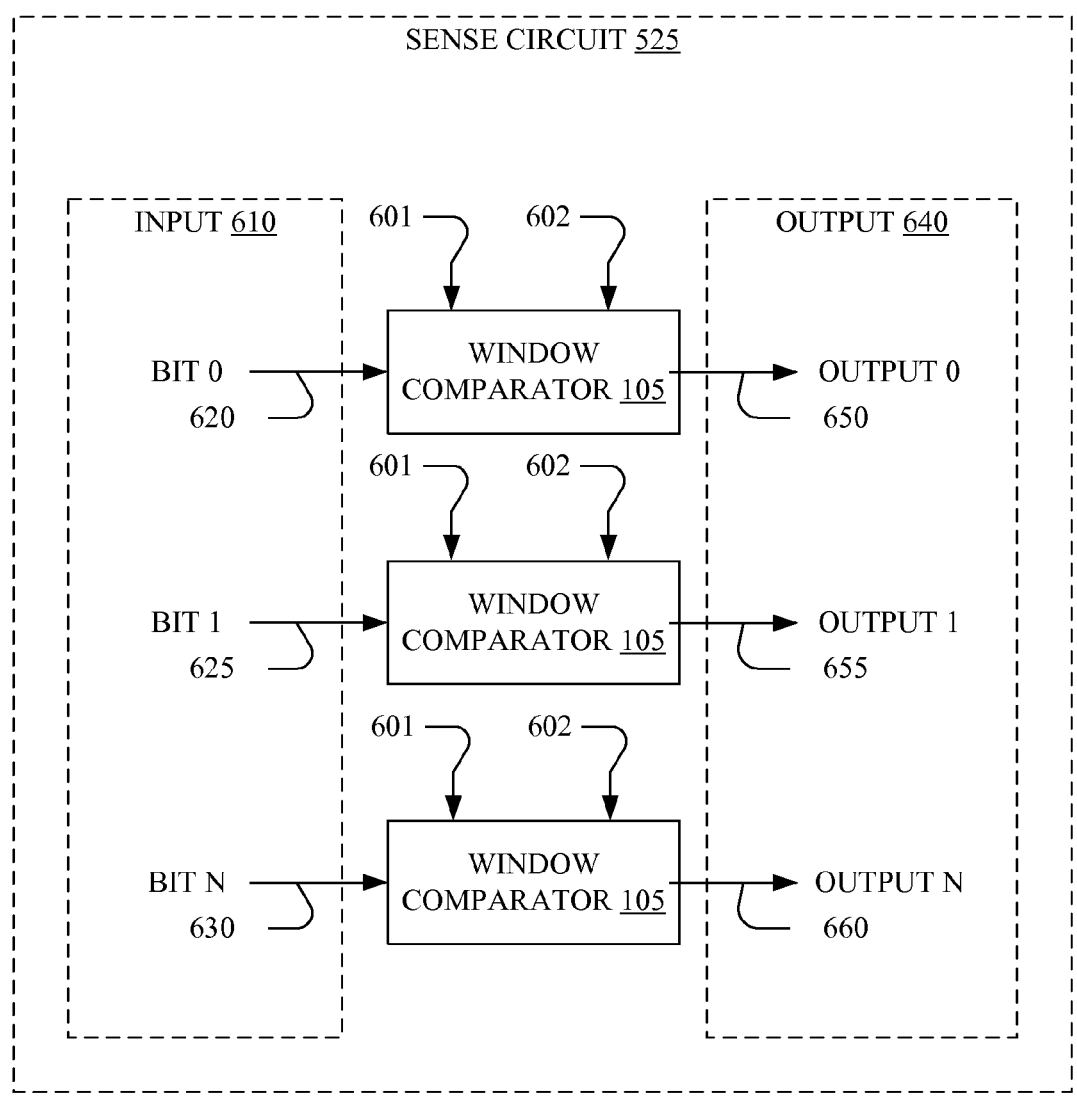
FIG. 6 is a schematic block diagram illustrating a sense circuit, in accordance with an embodiment of the invention.

FIG. 6 is a schematic block diagram illustrating sense circuit 525, in accordance with an embodiment of the invention. Sense circuit 525 senses a number of memory cell characteristics that changed state as a function of applying a plurality of different stimuli. In the illustrated embodiment, input 610 comprises three data bits (620 ("BIT 0"), 625 ("BIT 1"), and 630 ("BIT N")), each of the three data bits representing a characteristic of three memory cells of memory cells 520. In response to stimulus component 105 applying a reference stimulus coupled to window comparator 605 reference inputs 601 and 602 of the three window comparators 605, sense component 115 utilizes window comparators 605 to sense a number of memory cell characteristics that changed state as a function of applying the reference stimulus coupled to reference inputs 601 and 602. This process is repeated by serially applying (e.g., by way of incrementing or decrementing) the reference stimulus coupled to window comparator 605 reference inputs 601 and 602. Data store component 210 can be utilized to store data when a number of memory cell characteristics changed state within a desired reference stimulus window. Analysis component 120 can then determine a reference corresponding to an absolute minima point. Once the reference corresponding to the absolute minima point is determined, stimulus component 105 reapplies the reference stimulus coupled to window comparator 605 reference inputs 601 and 602, and sense component 115 senses the memory cells with the reference stimulus (i.e., the optimum reference point). Output 640 (i.e., outputs 650 ("OUTPUT 0"), 655 ("OUTPUT 1") and 660 ("OUTPUT N")) from window comparators 105 is stored in data store component 210

Figure 7:
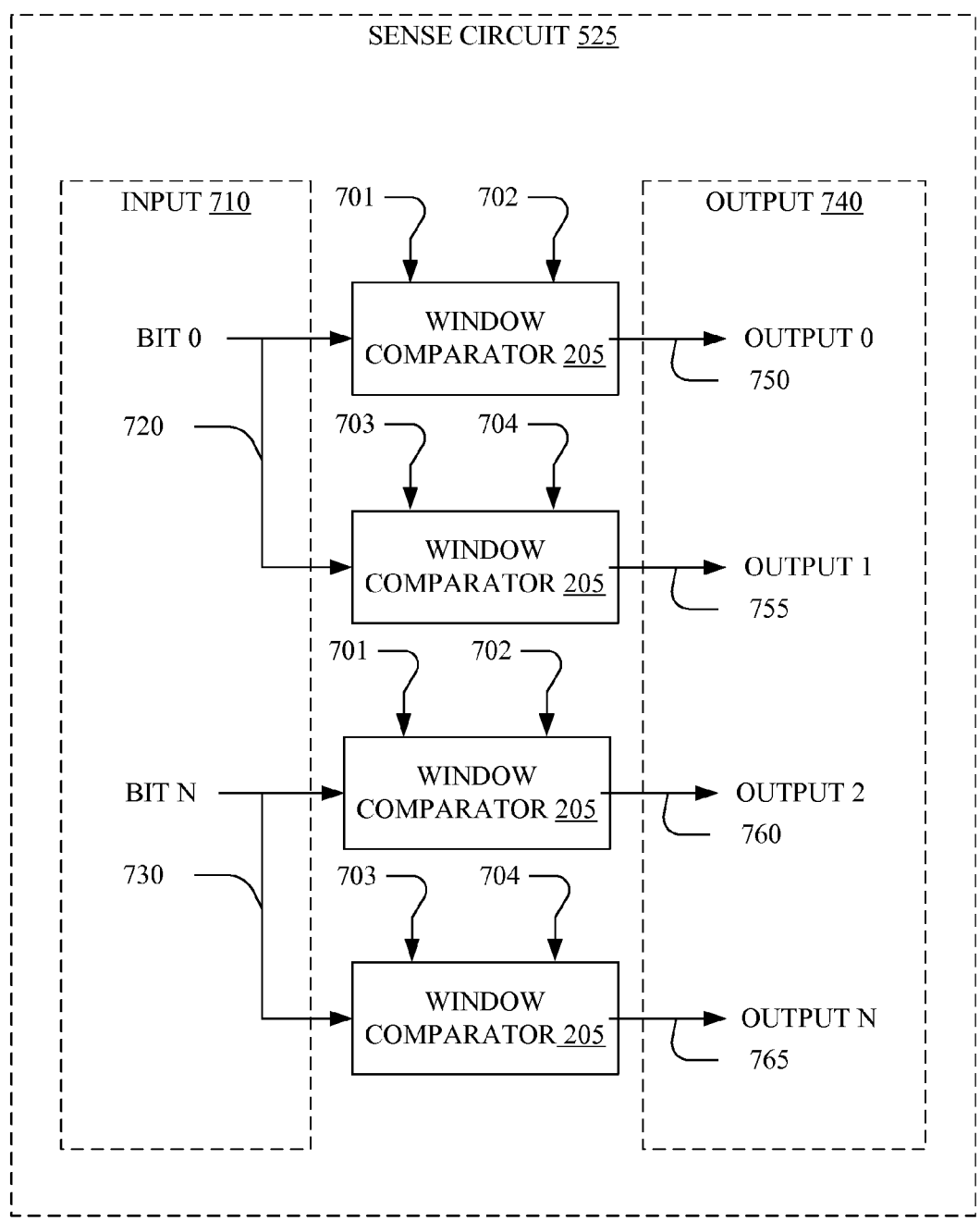
FIG. 7 is a schematic block diagram illustrating another sense circuit, in accordance with an embodiment of the invention.

FIG. 7 is a schematic block diagram illustrating another sense circuit 525, in accordance with an embodiment of the invention. In the illustrated embodiment, a plurality of window comparators 205 is coupled to each memory cell of memory cells 520 (i.e., at 720 and 730). By coupling a plurality of window comparators 205 to each memory cell, sense circuit 525 can collect data for absolute minima evaluation without serially changing a window comparator reference stimulus coupled to window comparator 205 reference inputs 701, 702, 703, and 704. In the illustrated embodiment, input 710 comprises data bits (720 ("BIT 0") and 730 ("BIT N")), each of the data bits representing a characteristic of memory cells 520. Output 740 (i.e., outputs 750 ("OUTPUT 0"), 755 ("OUTPUT 1"), 760 ("OUTPUT 2"), and 765 ("OUTPUT N")) represents data from window comparators 705, which is stored in data store component 210. Analysis component 120 can determine a reference corresponding to an absolute minima point as a function of the data from window comparators 205 stored in data store component 210. Once the reference corresponding to the absolute minima point is determined, stimulus component 105 applies the reference stimulus to one of the window comparators 205 at reference inputs 701 and 702, or at reference inputs 703 and 704, and sense component 115 senses the memory cells with the reference stimulus (i.e., the optimum reference point).

Figure 8:
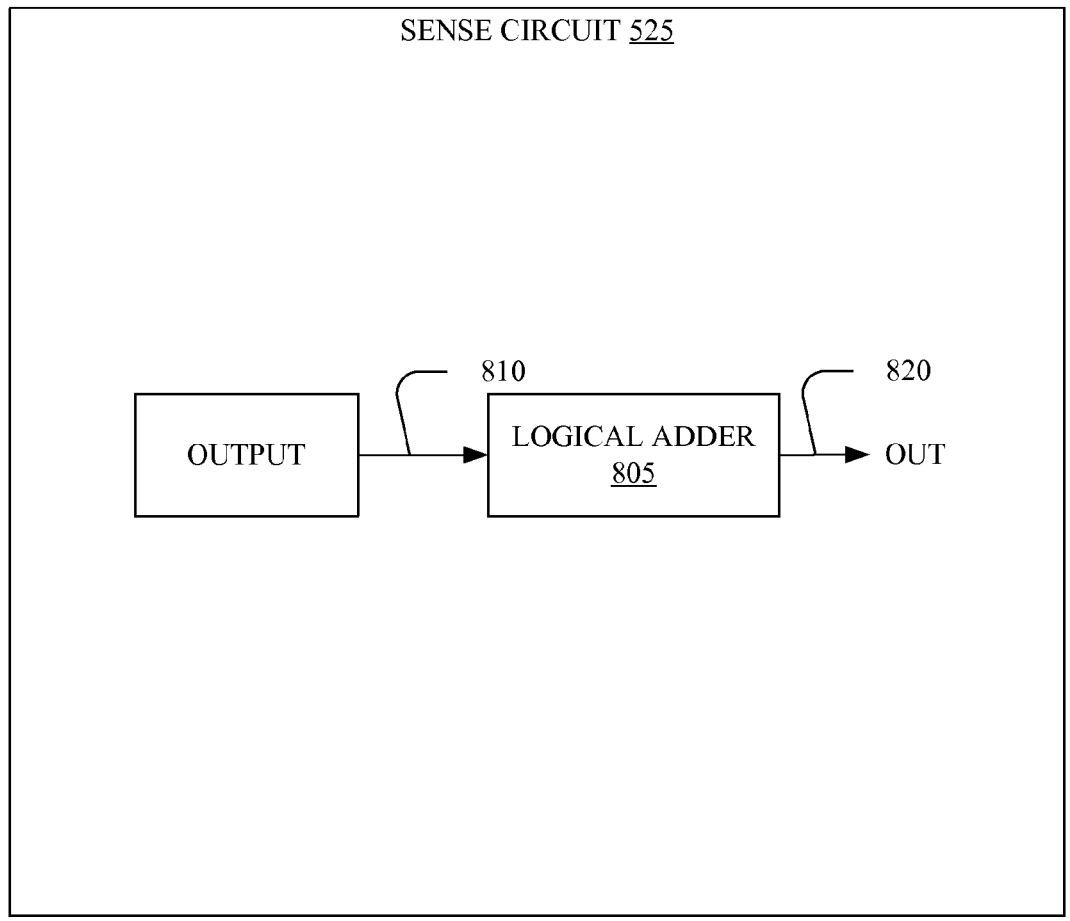
FIG. 8 is a schematic block diagram illustrating a sense circuit sensing a summation of a characteristic of more than one memory cell, in accordance with an embodiment of the invention.

FIG. 8 is a schematic block diagram illustrating a sense circuit 625 sensing a summation of a characteristic of more than one memory cell, in accordance with an embodiment of the invention. At 810, the characteristics of more than one memory cell are summed at the input of logical adder 805. At 820, logic adder 805 sums the number of memory cells sensed within a window defined by window comparator references 601 and 602.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events.

Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ).

Further, it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter. Moreover, the word "exemplary" is used herein to mean serving as an example, instance, or illustration. Any aspect or design described herein as "exemplary" is not necessarily to be construed as preferred or advantageous over other aspects or designs.

Figure 9:
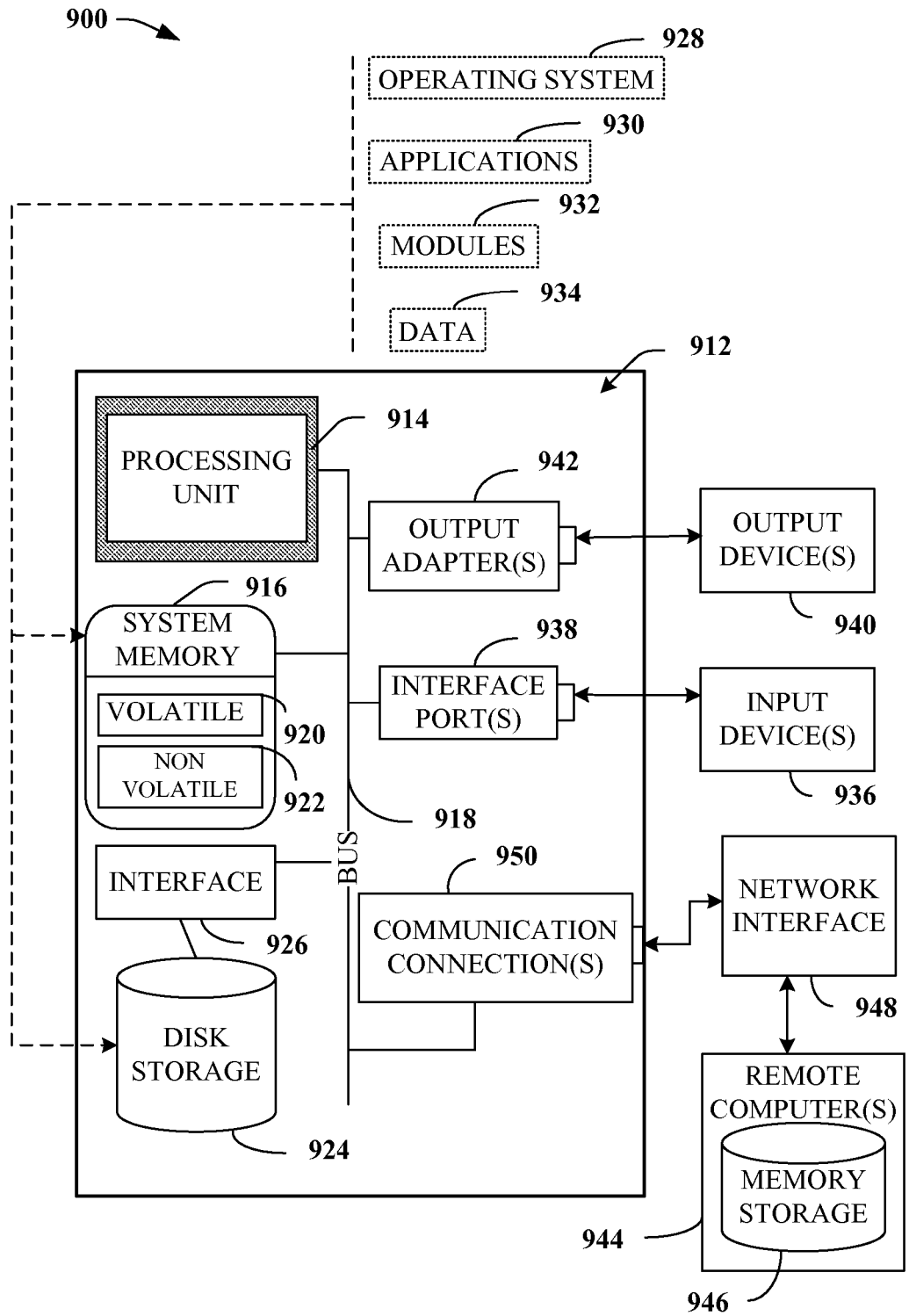
FIG. 9 is schematic block diagram illustrating a suitable operating environment.
Figure 10:
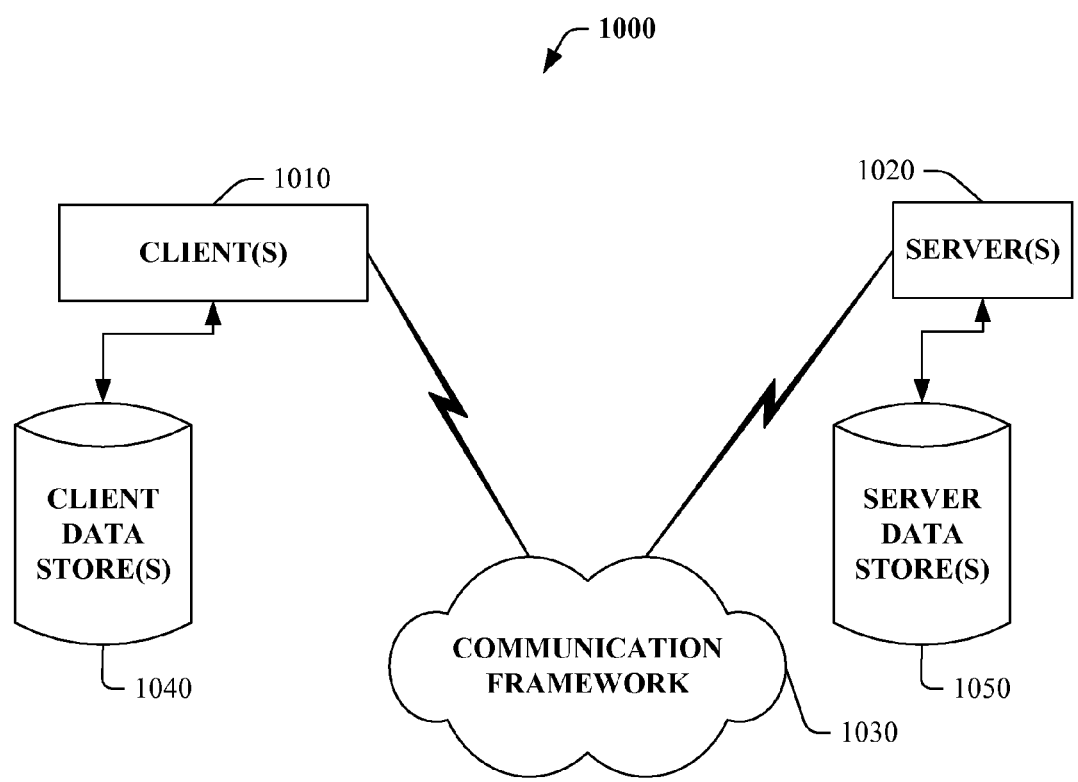
FIG. 10 is a schematic block diagram of a sample-computing environment.

In order to provide a context for the various aspects of the disclosed subject matter, FIGS. 9 and 10, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types.

Moreover, those skilled in the art will appreciate that the inventive systems may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 9, a suitable environment 900 for implementing various aspects of the claimed subject matter includes a computer 912. The computer 912 includes a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914.

The system bus 918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 916 includes volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include ROM, PROM, EPROM, EEPROM, or flash memory. Volatile memory 920 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ES-DRAM), Synchlink DRAM (SLDRAM), Rambus direct RAM (RDRAM), direct Rambus dynamic RAM (DRDRAM), and Rambus dynamic RAM (RDRAM).

Computer 912 also includes removable/non-removable, volatile/non-volatile computer storage media. FIG. 9 illustrates, for example, a disk storage 924. Disk storage 924 includes, but is not limited to, devices like a magnetic disk drive, floppy disk drive, tape drive, Jaz drive, Zip drive, LS-100 drive, flash memory card, or memory stick. In addition, disk storage 924 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 924 to the system bus 918, a removable or non-removable interface is typically used, such as interface 926.

It is to be appreciated that FIG. 9 describes software that acts as an intermediary between users and the basic computer resources described in the suitable operating environment 900. Such software includes an operating system 928. Operating system 928, which can be stored on disk storage 924, acts to control and allocate resources of the computer system 912. System applications 930 take advantage of the management of resources by operating system 928 through program modules 932 and program data 934 stored either in system memory 916 or on disk storage 924. It is to be appreciated that the disclosed subject matter can be implemented with various operating systems or combinations of operating systems.

A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936.

Thus, for example, a USB port may be used to provide input to computer 912, and to output information from computer 912 to an output device 940. Output adapter 942 is provided to illustrate that there are some output devices 940 like monitors, speakers, and printers, among other output devices 940, which require special adapters. The output adapters 942 include, by way of illustration and not limitation, video and sound cards that provide a means of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a personal computer, a server, a router, a network PC, a workstation, a microprocessor based appliance, a peer device or other common network node and the like, and typically includes many or all of the elements described relative to computer 912.

For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 950 refer(s) to the hardware/software employed to connect the network interface 948 to the bus 918. While communication connection 950 is shown for illustrative clarity inside computer 912, it can also be external to computer 912. The hardware/software necessary for connection to the network interface 948 includes, for exemplary purposes only, internal and external technologies such as, modems including regular telephone grade modems, cable modems and DSL modems, ISDN adapters, and Ethernet cards.

FIG. 10 is a schematic block diagram of a sample-computing environment 1000 with which the subject innovation can interact. The system 1000 includes one or more client(s) 1010. The client(s) 1010 can be hardware and/or software (e.g., threads, processes, computing devices). The system 1000 also includes one or more server(s) 1020. Thus, system 1000 can correspond to a two-tier client server model or a multi-tier model (e.g., client, middle tier server, data server), amongst other models. The server(s) 1020 can also be hardware and/or software (e.g., threads, processes, computing devices). The servers 1020 can house threads to perform transformations by employing the subject innovation, for example. One possible communication between a client 1010 and a server 1020 may be in the form of a data packet transmitted between two or more computer processes.

The system 1000 includes a communication framework 1030 that can be employed to facilitate communications between the client(s) 1010 and the server(s) 1020. The client(s) 1010 are operatively connected to one or more client data store(s) 1040 that can be employed to store information local to the client(s) 1010. Similarly, the server(s) 1020 are operatively connected to one or more server data store(s) 1050 that can be employed to store information local to the servers 1020.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art should recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system comprising:
   a stimulus component that applies a plurality of different reference stimuli to a plurality of memory cells of a memory device;
   a sense component that senses a characteristic of each memory cell of the plurality of memory cells as a function of the applied plurality of different reference stimuli; and
   an analysis component that computes an optimal reference stimulus by selecting one of the plurality of different reference stimuli, the one of the plurality of different reference stimuli associated with an absolute minima of number of memory cell characteristics that changed state as a function of the applied plurality of different reference stimuli.

2. The system of claim 1, wherein the stimulus component applies the optimal reference stimulus to each memory cell of the plurality of memory cells and wherein the sense component senses the characteristic of each memory cell of the plurality of memory cells as a function of the applied optimal reference stimulus.

3. The system of claim 1, further comprising a data store component that stores the sensed characteristic of each memory cell of the plurality of memory cells, wherein the analysis component computes the optimal reference stimulus as a function of the stored sensed characteristics.

4. The system of claim 3, further comprising an artificial intelligence component that automatically applies the plurality of different reference stimuli to the plurality of memory cells, senses the characteristic of each memory cell of the plurality of memory cells, stores the sensed characteristic of each memory cell of the plurality of memory cells, computes the optimal reference stimulus, and applies the optimal reference stimulus to each memory cell of the plurality of memory cells.

5. The system of claim 1, wherein the plurality of different reference stimuli comprises at least one of voltage or current, and wherein the sensed characteristic of each memory cell comprises at least one of drain current, threshold voltage, logic state, or an output of one or more sense amplifiers, the one or more sense amplifiers coupled to at least one memory cell of the plurality of memory cells.

6. The system of claim 3, wherein the stimulus component serially applies n different reference stimuli to the plurality of memory cells, wherein the sense component senses the characteristic of each memory cell of the plurality of memory cells as a function of the serially applied n different reference stimuli, and wherein the data store component stores the sensed characteristic of each memory cell of the plurality of memory cells.

7. The system of claim 6, wherein the analysis component computes a number of stored sensed characteristics that changed state as a function of the serially applied n different reference stimuli, wherein the analysis component computes the optimal reference stimulus by selecting one of the serially applied n different reference stimuli, and wherein the one of the serially applied n different reference stimuli is associated with an absolute minima of number of memory cell characteristics that changed state as a function of the serially applied n different reference stimuli.

8. The system of claim 1, wherein the sense component comprises one or more sense amplifiers.

9. The system of claim 8, wherein the one or more sense amplifiers comprises one or more window comparators.

10. The system of claim 9, wherein the sense component comprises one or more outputs of the one or more window comparators, the one or more window comparators coupled to at least one memory cell of the plurality of memory cells, and wherein the analysis component computes the optimal reference stimulus by selecting a reference stimulus within a window region of one of the one or more window comparators, the least number of memory cells of the plurality of memory cells activating the one or more outputs of the one of the one or more window comparators.

11. The system of claim 1, wherein each memory cell of the plurality of memory cells is a volatile or non-volatile memory cell.

12. The system of claim 11, wherein each memory cell of the plurality of memory cells is at least one of flash memory, multi-bit flash memory, read only memory ("ROM"), programmable ROM ("PROM"), erasable programmable read only memory ("EPROM"), electronically erasable programmable read only memory ("EEPROM"), random access memory ("RAM"), synchronous RAM ("SRAM"), dynamic RAM ("DRAM"), synchronous DRAM ("SDRAM"), double data rate SDRAM ("DDR SDRAM"), enhanced SDRAM ("ESDRAM"), Synchlink DRAM ("SLDRAM"), Rambus direct RAM ("RDRAM"), direct Rambus dynamic RAM ("DRDRAM"), Rambus dynamic RAM ("RDRAM"), or a combination thereof.

13. A method comprising:
   applying a plurality of different reference stimuli to a plurality of memory cells of a memory device;
   sensing a characteristic of each memory cell of the plurality of memory cells as a function of the applied plurality of different reference stimuli; and
   computing an optimal reference stimulus by selecting one of the plurality of different reference stimuli, the one of the plurality of different reference stimuli associated with an absolute minima of number of memory cell characteristics that changed state as a function of the applied plurality of different reference stimuli.

14. The method of claim 13, further comprising:
applying the optimal reference stimulus to each memory cell of the plurality of memory cells;
sensing the characteristic of each memory cell of the plurality of memory cells as a function of the applied optimal reference stimulus;
storing the sensed characteristic of each memory cell of the plurality of memory cells; and
computing the optimal reference stimulus as a function of the stored sensed characteristics.

15. The method of claim 14, further comprising:
serially applying n different reference stimuli;
sensing the characteristic of each memory cell as a function of the serially applied n different reference stimuli; and
storing the sensed characteristic of each memory cell as a function of the serially applied n different reference stimuli.

16. The method of claim 15, further comprising:
computing a number of stored sensed characteristics that changed state as a function of the serially applied n different reference stimuli; and
selecting one of the serially applied n different reference stimuli, the one of the serially applied n different reference stimuli associated with an absolute minima of number of memory cell characteristics that changed state as a function of the serially applied n different reference stimuli.

17. The method of claim 13, further comprising:
sensing the characteristic of each memory cell of the plurality of memory cells as a function of one or more outputs of one or more window comparators, the one or more window comparators coupled to the plurality of memory cells; and
computing the optimal reference stimulus by selecting a reference stimulus within a window region of one of the one or more window comparators, the least number of memory cells activating the one or more outputs of the one of the one or more window comparators.

18. A system comprising:
a means for applying a plurality of different reference stimuli to a plurality of memory cells of a memory device;
a means for sensing a characteristic of each memory cell of the plurality of memory cells as a function of the applied plurality of different reference stimuli; and
a means for computing an optimal reference stimulus by selecting one of the plurality of different reference stimuli, the one of the plurality of different reference stimuli associated with an absolute minima of number of memory cell characteristics that changed state as a function of the applied plurality of different reference stimuli.

19. The system of claim 18, further comprising:
a means for storing the sensed characteristic of each memory cell of the plurality of memory cells; and
a means for computing the optimal reference stimulus as a function of the stored sensed characteristics.

20. The system of claim 19, further comprising:
a means for serially applying n different reference stimuli to the plurality of memory cells;
a means for sensing the characteristic of each memory cell as a function of the serially applied n different reference stimuli;
a means for computing the number of stored sensed characteristics that changed state as a function of the serially applied n different reference stimuli; and
a means for selecting one of the serially applied n different reference stimuli, the one of the serially applied n different reference stimuli associated with an absolute minima of number of memory cell characteristics that changed state as a function of the serially applied n different reference stimuli.

* * * * *